United States Patent [19]
Chism

[11] Patent Number: 4,888,548
[45] Date of Patent: Dec. 19, 1989

[54] PROGRAMMATICALLY GENERATED IN-CIRCUIT TEST OF DIGITAL TO ANALOG CONVERTERS

[75] Inventor: Wayne R. Chism, Greeley, Colo.

[73] Assignee: Hewlett-Packard Company, Palo Alto, Calif.

[21] Appl. No.: 175,713

[22] Filed: Mar. 31, 1988

[51] Int. Cl.$^4$ ............... G01R 19/257; G01R 31/00
[52] U.S. Cl. ........................ 324/73 R; 341/120; 371/22.5
[58] Field of Search ............ 324/73 R; 341/120; 371/25

[56] References Cited

U.S. PATENT DOCUMENTS

| | | |
|---|---|---|
| 3,872,441 | 3/1975 | Cailow . |
| 4,092,589 | 5/1978 | Chau et al. . |
| 4,222,107 | 9/1980 | Mrozowski et al. ............... 341/120 |
| 4,266,292 | 5/1981 | Regan et al. ........................ 371/25 |
| 4,340,856 | 7/1982 | Orlandi . |
| 4,425,561 | 1/1984 | Whiteside et al. ................ 341/120 |
| 4,497,056 | 1/1985 | Sugamori . |
| 4,580,126 | 4/1986 | Kato et al. . |
| 4,591,828 | 5/1986 | Storey ............................... 341/120 |
| 4,698,088 | 10/1987 | Hwang et al. . |
| 4,710,747 | 12/1987 | Holland . |
| 4,711,024 | 12/1987 | Russell ............................ 324/73 R |
| 4,724,380 | 2/1988 | Burrows et al. . |
| 4,733,167 | 3/1988 | Tamamura . |
| 4,743,841 | 5/1988 | Takeuchi . |
| 4,748,403 | 5/1988 | Tamamura . |
| 4,754,215 | 6/1988 | Kawai . |

Primary Examiner—Reinhard J. Eisenzopf
Assistant Examiner—W. Burns
Attorney, Agent, or Firm—William W. Cochran, II

[57] ABSTRACT

A device and process for programmatically controlled in-circuit pin checks and gross functionality tests of digital to analog converters. The tests provide deterministic bit checks for higher order bits and non-deterministic or "delta" bit checks of low order bits independent of other circuitry on the printed circuit board of which the digital to analog converter is a component.

16 Claims, 5 Drawing Sheets

```
┌─────────────────────────────────────┐
│ START NON-DETERMINISTIC BIT CHECK   │──── 54
│      FOR LOW ORDER BITS             │
└─────────────────────────────────────┘
                 │
                 ▼
┌─────────────────────────────────────┐
│ APPLY SELECTED LOW ORDER BIT        │
│ PATTERN TO DATA INPUT 21 OF         │──── 56
│ D/A CONVERTER UNDER TEST 10 BY      │
│ MEANS OF DIGITAL DRIVERS 24         │
└─────────────────────────────────────┘
                 │
                 ▼
┌─────────────────────────────────────┐
│ WAIT FOR SETTLING AND CONVERSION    │──── 58
│ COMPLETION AND THEN MEASURE THE     │
│ D/A CONVERTER 10 OUTPUT AT LINE     │
│ 23 USING MEASURING OP-AMP 26        │
│ AND DC DETECTOR 28 RECORDING        │
│ MEASURED VALUE IN COMPUTER          │
└─────────────────────────────────────┘
```

FIG 4

Flowchart steps:
- 54: START NON-DETERMINISTIC BIT CHECK FOR LOW ORDER BITS
- 56: APPLY SELECTED LOW ORDER BIT PATTERN TO DATA INPUT 21 OF D/A CONVERTER UNDER TEST 10 BY MEANS OF DIGITAL DRIVERS 24
- 58: WAIT FOR SETTLING AND CONVERSION COMPLETION AND THEN MEASURE THE D/A CONVERTER 10 OUTPUT AT LINE 23 USING MEASURING OP-AMP 26 AND DC DETECTOR 28 RECORDING MEASURED VALUE IN COMPUTER
- 60: ITERATIONS COMPLETE FOR THIS BIT — NO → 62; YES ↓
- 62: ALTER SPECIFIC LOW OREDR BIT FROM "1" TO "0" OR "0" TO "1" AS REQUIRED
- 64: EVALUATE RESPONSE IN COMPUTER BY CALCULATING DIFFERENCE BETWEEN RESPONSE FOR BIT STATE "1" AND BIT STATE "0"
- COMPARE TO EXPECTED RESPONSE TO DETERMINE "PASS" OR "FAIL"
- 66: ARE ALL LOW ORDER BITS CHECKED? — NO → back to 56; YES → FIG 5

PROGRAMMATICALLY GENERATED IN-CIRCUIT TEST OF DIGITAL TO ANALOG CONVERTERS

BACKGROUND OF THE INVENTION

A. Field of Invention

This invention pertains generally to the in-circuit functionality testing of hybrid circuit components, i.e. those having both analog and digital input/output ports; and more specifically to a device and procedure to provide for programmatically generated in-circuit measurement and testing of general purpose digital to analog converters.

B. Description of the Background

For this invention, in-circuit test or measurement refers to printed circuit board test procedures which, through the use of various isolation techniques, perform "pin checks" and "gross functionality tests" on individual board components regardless of the specific circuit configuration or the effects of surrounding components. "Pin checks" are tests specifically designed to verify appropriate electrical activity on all device pins (the physical connections to the devices). "Gross functionality tests" are more comprehensive than pin checks and refer to tests designed to verify the basic function of the part in addition to simply verifying pin activity. Neither test provides full functionality tests of the component specifications.

The proliferation of "hybrid" electronic components, i.e. integrated circuits incorporating both analog and digital functions in their design, has rendered standard fault detection techniques obsolete, and has created manufacturing and quality control problems for printed circuit board assemblies utilizing these devices. Central to this problem are the class of components known as converters, of which there are two basic types. The digital to analog converter (D/A) converts a digital input signal to and analog output signal, and the analog to digital converter (A/D) converts an analog input signal to a digital output signal. Neither conventional analog or digital in-circuit test techniques alone will suffice as a means of performing an in-circuit functionality test of these hybrid components. As a result, printed circuit board assemblies utilizing D/A and A/D converters have been difficult to check, due to the previously intractable problem of programmatically generating in-circuit tests of these components.

SUMMARY OF THE INVENTION

The present invention overcomes the disadvantages and limitations of the prior art by providing a device and methodology for the in-circuit functionality testing of digital to analog converters. This is accomplished by: electronically isolating the converter under test from its attendant circuitry (by means of guarding, digital overdriving and analog overdriving), programmatically stimulating the input ports with a specific bit pattern, and finally measuring the converter response and comparing this output to an expected value. This process is repeated as many times as necessary to completely evaluate the specific converter under test. The device of the present invention may be used effectively to evaluate both high order and low order bits through respective deterministic and non-deterministic bit checks. Testing is thus possible in an electrically noisy test environment, and is independent of the downstream and upstream circuitry surrounding the device under test.

BRIEF DESCRIPTION OF THE DRAWINGS

FIG. 4 is a schematic flow diagram of the procedure for a non-deterministic check of low order bits for a typical digital to analog converter in accordance with the present invention.

DETAILED DESCRIPTION OF THE INVENTION

Figure 1:
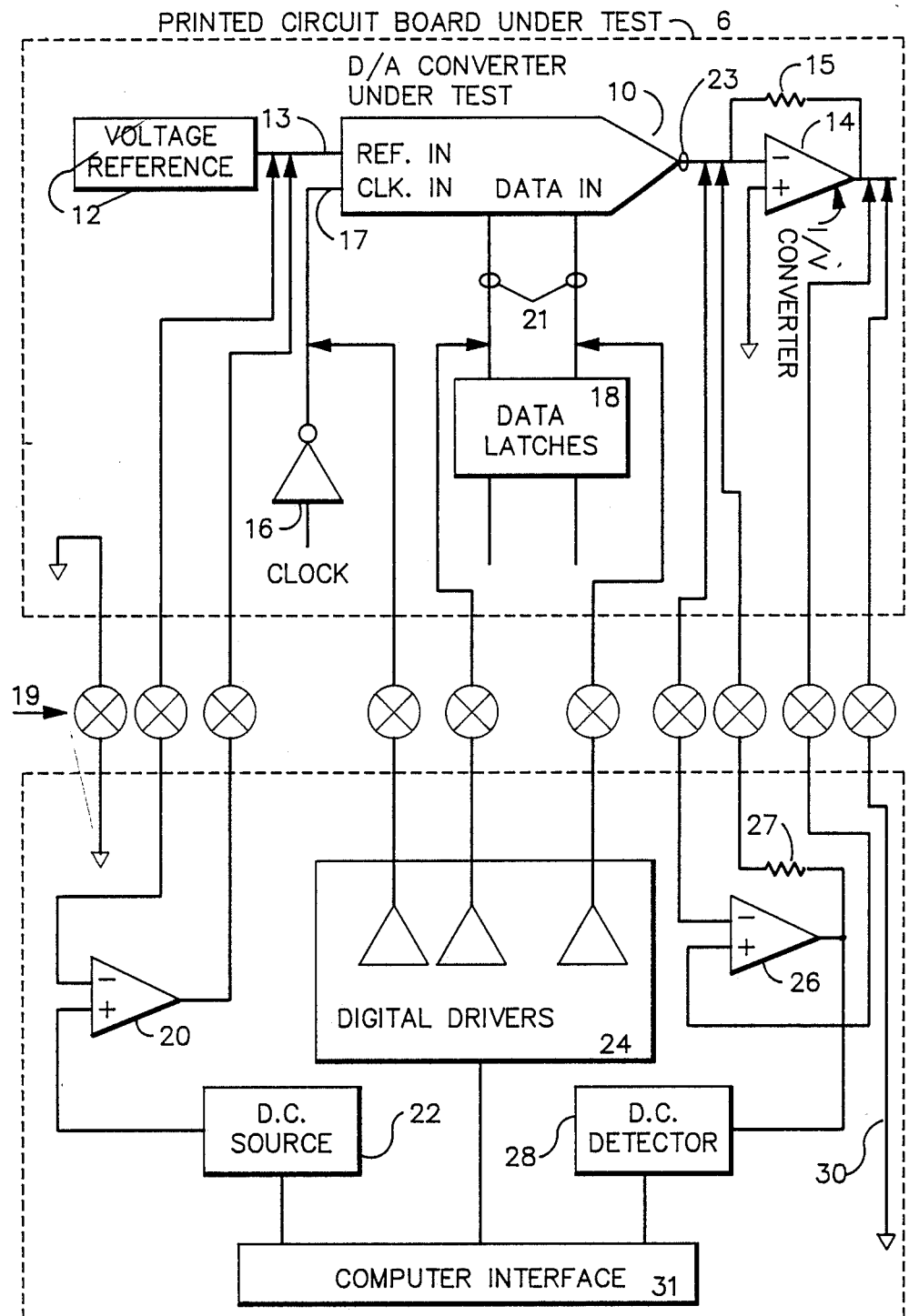
FIG. 1 is a schematic circuit diagram of the test module for testing a digital to analog converter in a typical printed circuit board configuration in accordance with the present invention.

FIG. 1 discloses the schematic diagram of a test module 8 for performing programmatically generated in-circuit circuit "pin checks" and "gross functionality tests" of a digital to analog converter 10 which is one component of the printed circuit board assembly 6 under test. The test module 8 is driven through a computer interface 31 and a test program generated for the specific D/A converter being tested; and is interfaced to the printed circuit board 6 under test through a test fixture and scanner relays 19.

In order to perform an in-circuit test, the test module 8 must isolate the D/A converter 10 under test from all surrounding circuitry, stimulate the converter and then make appropriate measurements to determine converter functionality. Isolation techniques are provided for the digital data inputs 21 and clock input 17; as well as for the analog input and output circuitry, specifically the voltage reference input 13, and the analog D/A converter output 23. The measurements are then made at the D/A converter output 23 to determine the functionality of the D/A converter 10.

A digital bit pattern varying nominally from 6 to 16 bits in width is supplied to the digital inputs 21 of the D/A converter 10 under test by means of digital overdriving drivers 24. The use of digital overdriving permits the application of these desired patterns directly at the converter inputs 21, independent of other digital circuitry, such as data latches 18, on the board under test 6. Depending on the exact configuration of the D/A converter under test, similar digital overdrive techniques are used to control clock lines 17 in sequencing the required digital patterns.

The digital overdrive isolation is in effect for the duration of the test, from initial digital pattern application through the analog measurement of the output. This may be of concern as long periods of digital overdrive can result in damage to upstream components (the data latches 18 or clock driver 16 in the diagram). However, the test module 8 is designed so as to permit rapid completion of the test process—on the order to 100 $\mu$s to 200 $\mu$s depending on the converter under test. This includes time for pattern application, output settling, measurement, as well as overhead time within the test module 8. Digital overdrive for the times discussed here is well within the tolerance of most integrated circuits as long as the overdrive test levels are accurately set and controlled by the test module 8.

All D/A converters require a precision reference 12 on which the absolute accuracy of the conversion is based. This reference may be either internal or external to the actual converter, however in all cases it is pinned out and therefore available external to the converter package. In order to isolate the converter itself from this on board reference 12, the test module 8 utilizes a DC source 22, and an analog overdrive amplifier 20 with remote sensing (at its negative input) to impose the voltage determined by the test module 8 directly on the reference input 13 to the D/A converter 10. Then at this point, with the isolation of on board digital and analog signals in place and with an appropriate digital stimulus applied to the D/A converter inputs 21, the test cycle can be completed by making appropriate measurements at the analog output 23 of the D/A converter under test.

Depending on the specific converter under test, the analog output of the converter may be either a voltage or a current. For a voltage output converter, the output measurement is made by simply measuring this output voltage using DC detector 28. For a current output converter, a more elaborate guarding scheme (illustrated in FIG. 1.) is required to isolate the converter output from downstream circuitry before the measurement can be made. Here, the test module 8 uses a Measurement Operational Amplifier (MOA) 26 in conjunction with a guard connection 30 to isolate the D/A converter output from associated downstream circuitry (the I/V converter 14 and its associated feedback resistor 15). The guard connection 30 effectively disables the onboard I/V converter 14 by holding its output at ground potential. Current from the output 23 of the D/A converter 10 under test is then shunted away from the on board I/V converter 14 and into the test module for measurement. The MOA 26 and associated feedback resistor 27 effectively replace the on board I/V converter 14 permitting independent evaluation of the D/A converter function. Remote sense connections are used at both the positive and negative inputs of the MOA 26 to further enhance the measurement process. A voltage measurement at the output of the MOA 26 using the test module DC detector 28 then completes the test cycle.

The most difficult overall aspect of the test process is the detection of changes in the analog output due to changes in the least significant bits of digital input. Analog levels associated with the least significant bit for typical D/A converters is on the order of 30 nA or 150 uV for current and voltage output devices respectively. This measurement problem is further aggravated by the electrically noisy test environment resulting from the digital overdriving of converter digital inputs. The test module 8 in FIG. 1 utilizes remote sensing (of both the reference voltage 12 and at the MOA 26) and guarding 30 as techniques by which to minimize these problems. The remote sensing and guarding assure the accuracy of applied and detected voltages and effectively cancel out level shifts due to digital overdriving. Delta measurements at the DC detector 28, multiple measurement averaging, and filtering are techniques also used as means by which to resolve these low order bits non-deterministically.

Figure 2:
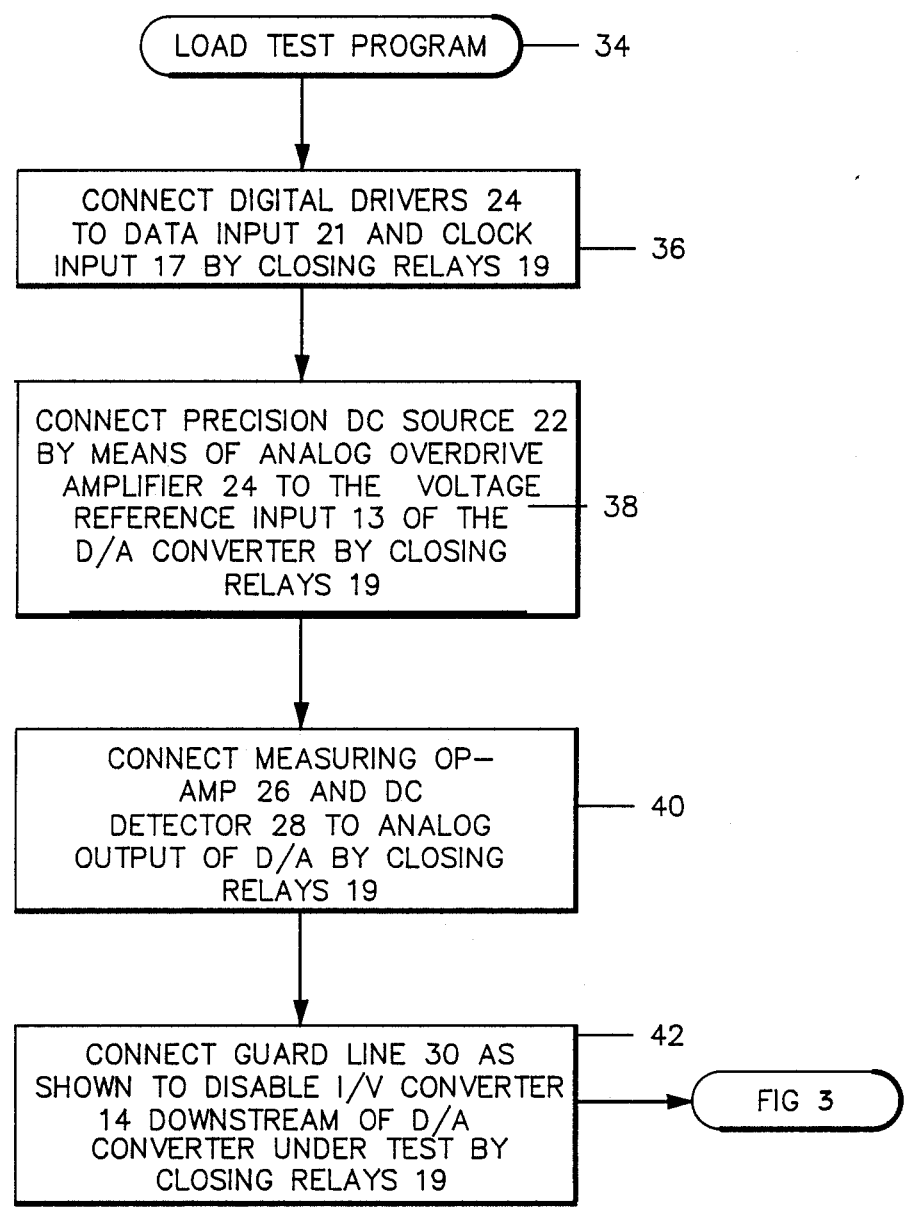
FIG. 2 is a schematic flow diagram of the test setup procedure for testing a typical digital to analog converter employed in accordance with the present invention.

FIG. 2 discloses a schematic flow diagram of the test setup procedure for performing an in-circuit "pin test" and "gross functionality test" of a digital to analog (D/A) converter using the test module of FIG. 1.

The test setup consists of loading the appropriate test program 34 and making all electrical connections through scanner relays 19 to the D/A converter under test 10 as shown in FIG. 1. Here, in step 36, the digital drivers 24 are connected to the data inputs 21 and clock input 17. Next, in step 38, the precision DC source 22 is connected to the reference input 13 of the D/A converter under test 10 by means of a remote sensed overdriving amplifier 20. This allows the overdriving of the voltage reference 12, thus imposing the desired voltage directly at the converter reference input 13. The final, step 40, configures the converter output for measurement by connecting the Measuring Operational Amplifier (MOA) 26 and DC detector 28 in a remote sensed configuration to the converter output 23. A guard connection 30 is also made, in step 42, to provide for the isolation of the converter from downstream components 14 and 15 on the circuit board 6 under test.

Figure 3:
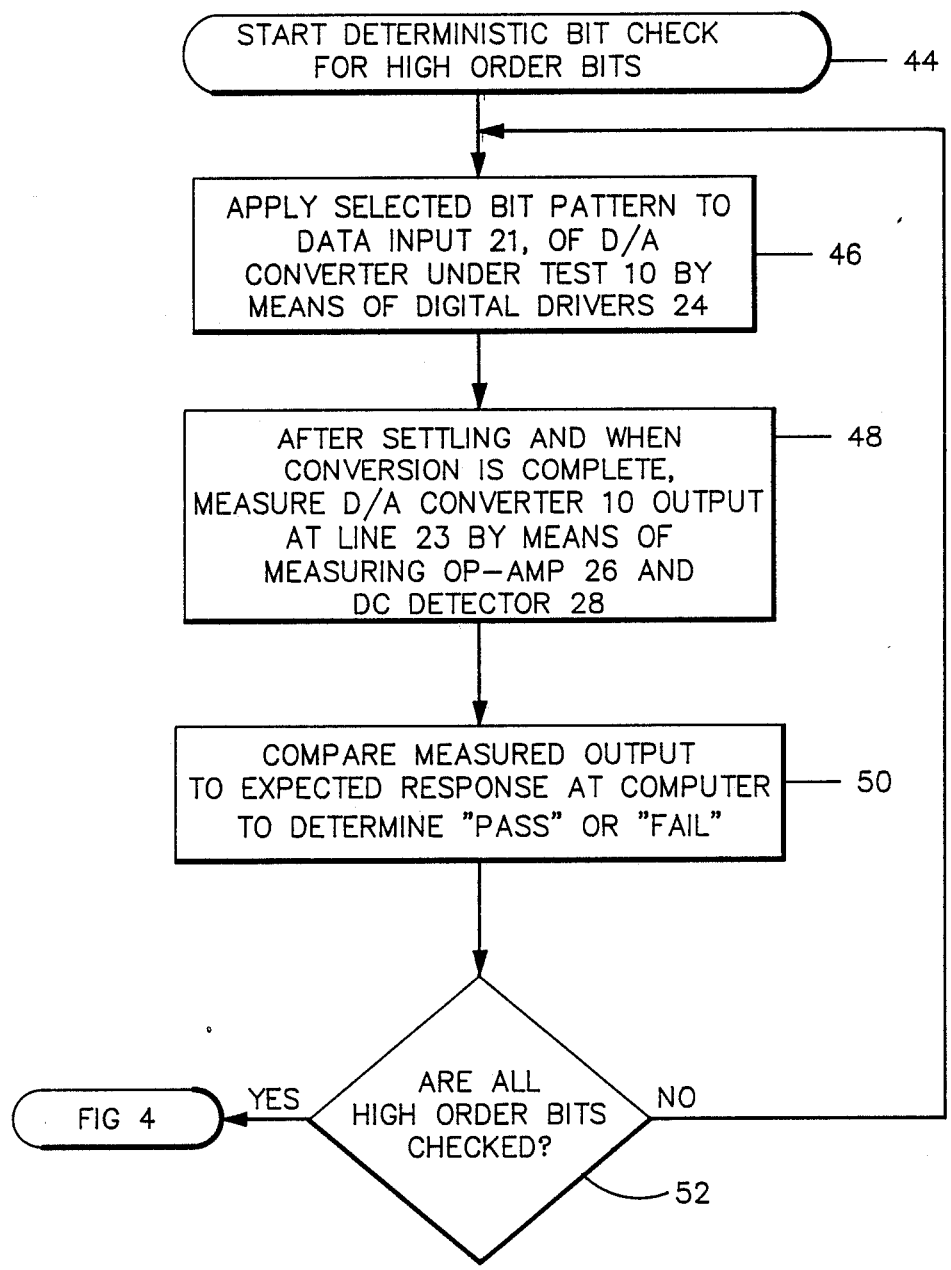
FIG. 3 is a schematic flow diagram of the procedure for a deterministic check of high order bits for a typical digital to analog converter in accordance with the present invention.

FIG. 3 discloses the procedural steps for a deterministic bit check of the higher order bits (those input bits resulting in higher current or voltage changes at the output) of the typical D/A converter 10 under test. This is accomplished programmatically by activating, in step 44, the following sequence. In step 46 an appropriate higher order bit pattern is applied to the D/A converter 10 under test by means of the overdriving digital drivers 24 connected to the data inputs 21 and clock input 17. With this digital pattern in place, a programmed delay before measurement is made to allow for conversion and settling. The output of the D/A converter is then measured and recorded, in step 48, using the MOA 26 and the DC detector 28. This measured value is then compared directly to the expected response, in step 50, to determine the pass or fail outcome of the test. This sequence is then repeated under program control until all high order bits of the D/A converter 10 being tested have been deterministically measured.

The test then proceeds with step 54, as disclosed in FIG. 4 with the delta measurement or non-deterministic evaluation of lower order bits (those input bits resulting in low current or voltage changes at the output) of the D/A converter 10 under test. In step 56, an appropriate low order bit pattern is applied to the D/A converter 10 under test by means of the overdriving digital drivers 24 connected to the data inputs 21 and clock input 17. Again, in step 58, after a delay for conversion and settling, the output of the D/A converter 10 is measured using the MOA 26 and the DC detector 28. However, unlike the deterministic bit check where the measured value is compared directly to an expected response; the functionality of lower order bits (which is highly susceptible to electrical noise in the test environment), is verified non-deterministically through the following additional steps 60, 62 and 64.

For this procedure, a second stimulus and measurement is conducted with one change made to the digital input pattern as depicted in step 62. Specifically, if the first measurement was made with the low order bit under evaluation set to a "0", the identical set of measurements are now made with this bit set to a "1". The two analog results can now be compared, in step 64, and the difference or delta evaluated in order to determine the functionality of the specific bit in question. This procedure—using deltas or difference measurements—permits considerably higher resolution of low order bit information than would be possible by direct measurement. The delta determined between the two tests is then compared to expectations in order to determine the pass or fail outcome of the test. This sequence is then repeated under program control until all low order bits of the D/A converter being tested have been evaluated in step 66.

Additionally, the crossover point from "low order" bits to "high order" bits is determined by the specifications of the D/A converter 10 under test. This information is incorporated into the test program and the appropriate test technique is then applied to each bit of the converter as dictated by its specifications.

Figure 5:
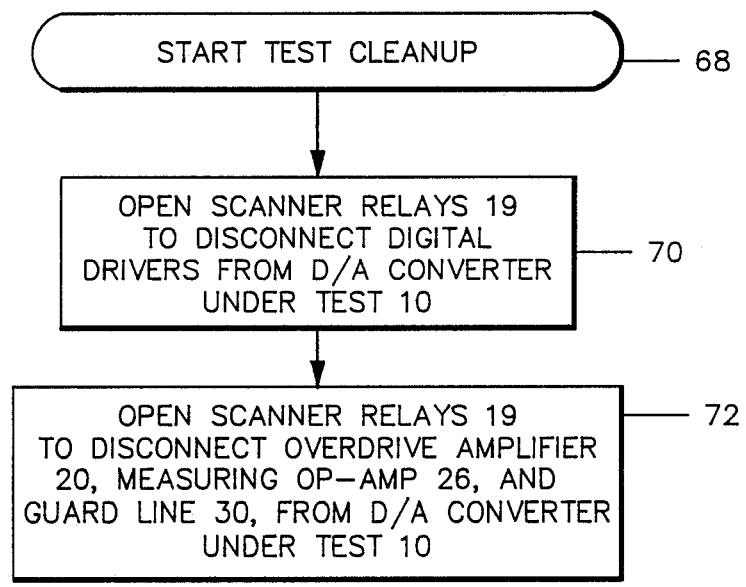
FIG. 5 is a schematic flow diagram of the last clean up procedure for the test of a typical digital to analog converter in accordance with the present invention.

The final phase of the procedure disclosed in FIG. 5 is the cleanup 68 of the test setup. Here, in steps 70 and 72, all lines between the converter 10 under test and the test module 8 are disconnected. This is accomplished by opening scanner relays 19.

The disclosed procedures cover the test requirements of a typical D/A converter. Depending on the exact converter specifications and/or features, this procedure may be truncated into fewer steps in order to increase throughput or further partitioned into more steps in order to cover specific requirements.

The present invention therefore provides a unique means and method of programmatically generating in-circuit gross functionality tests of digital to analog converters independent of the circuit in which the converter resides. The present invention therefore provides a method of quality control in the manufacture of printed circuit boards containing these hybrid devices.

The forgoing description of the invention has been presented for purposes of illustration and description. It is not intended to be exhaustive or to limit the invention to precisely the form disclosed, as other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except as limited by the prior art.

What is claimed is:

1. A module for programmatic testing of a digital to analog converter that is connected to components in a circuit comprising:
   direct current voltage generator means remote from the circuit for generating a precision direct current signal;
   analog overdriving amplifier means for amplifying said precision direct current voltage signal to isolate said digital to analog converter from upstream analog components;
   overdriving digital driver means for stimulating clock and data input ports of said digital to analog converter to isolate and stimulate said digital to analog converter;
   measuring op-amp means with a direct current detector means for measuring an output current from said digital to analog converter;
   guard connection means for disabling all downstream circuitry for isolation of said digital to analog converter from said downstream circuitry during testing;
   comparator means for comparing said output measurements with an expected response.

2. The module of claim 1 wherein said direct current voltage generator means comprises:
   means for generating a range of ±10.0 volts at a minimum resolution of 3.0 mV and an accuracy of ±0.1%.

3. The module of claim 1 wherein said analog overdriving amplifier means comprises:
   means for generating a minimum output current of 150 mA with maximum output impedance of 3.0 ohms.

4. The module of claim 1 wherein said overdriving digital driver means comprises:
   means for generating a range of −3.5 to 5.0 volts at a minimum resolution of 5.0 mV, and current capability of ±500 mA.

5. The module of claim 1 wherein said measurement operational amplifier means comprises:
   means for generating an output voltage range of ±10.0 volts, with a minimum output current of ±150 MA, and with an output resistance of less than 3.0 ohms.

6. A process for programmatically performing in-circuit pin checks and gross functionality tests of a digital to analog converter which is a component in a circuit, comprising the steps of:
   providing a test module having a precision DC source means for providing a desired reference signal;
   connecting the test module to the circuit;
   isolating the digital to analog converter under test from surrounding circuitry;
   applying the reference signal to a reference input of said digital to analog converter and an appropriate bit pattern to digital data inputs of said digital to analog converter;
   measuring an output current of said digital to analog converter under test;
   comparing said output current to an expected response for said digital to analog converter;
   evaluating the digital to analog converter performance using deterministic and non-deterministic bit evaluation techniques for testing high and low order bits.

7. The process of claim 6, further comprising the steps of:
   connecting the precision DC source means through a remote sensed analog overdriving amplifier to a reference input of said digital to analog converter;
   connecting overdriving digital drivers to data input ports and clock input port of said digital to analog converter;
   connecting a measuring operating amplifier and a DC detector to a current output port of said digital to analog converter under test;
   connecting a guard line to disable circuitry downstream of said digital to analog converter.

8. The process of claim 6, wherein said deterministic bit evaluation for high order bits of said digital to analog converter further comprises the steps of:
   applying said appropriate bit pattern to said digital data inputs and clock inputs of said digital to analog converter under test;
   waiting for conversion delay and settling of transients in said circuit;
   measuring said output current of said digital to analog converter under test using said measuring operating amplifier and precision DC detector to produce a measured result;

evaluating said measured results against an expected response for said bit configuration;

repeating said preceding steps to test each given high order bit configuration.

9. The process of claim 6, wherein said nondeterministic evaluation of low order bits of said digital to analog converter further comprises the steps of:

applying said appropriate bit pattern to said digital data inputs and clock input of said digital to analog converter;

waiting for conversion delay and settling of transients in said circuit under test;

measuring said current output of said digital to analog converter using said measuring operating amplifier and precision DC detector to produce a measured result;

repeating said previous steps with a one bit change in said applied digital bit pattern a "1" to "0" or "0" to "1";

evaluating said measured results by calculating a difference between said two measured configurations;

repeating said preceding steps to test each given low order bit configuration.

10. The module of claim 1 wherein the analog overdriving amplifier means applies a direct current voltage signal to a reference input of the digital to analog converter and includes a remote sense input for measuring the actual direct current signal applied to the reference input.

11. The module of claim 1 further comprising a computer interface for supplying digital data to the overdriving digital driver means, controlling the direct current voltage generator means and receiving data from the direct current detector means.

12. The module of claim 1 wherein the direct current voltage generator means operates under control of a computer to apply a desired voltage directly to a reference voltage input of the digital to analog converter.

13. The module of claim 1 wherein the measuring op amp includes a remote sense input for measuring an output of an I/V converter coupled to the output of the digital to analog converter.

14. The module of claim 1 wherein the analog overdriving amplifier means applies a direct current voltage signal to a reference input of the digital to analog converter and an I/V converter is coupled to an output of the digital to analog converter, further comprising a remote sense input on the analog overdriving amplifier means for measuring the actual direct current signal applied to the reference input and a remote sense input on the measuring op amp means for measuring an output of the I/V converter.

15. The module of claim 1 wherein an I/V converter is coupled to an output of the digital to analog converter and the guard means disables the I/V converter by holding an output thereof at ground potential, current from the output of the digital to analog converter being shunted to the measuring op amp means.

16. The module of claim 1 further comprising means for deterministically and non-deterministically testing high and low order bits of the digital to analog converter.

* * * * *